United States Patent [19]
Plewes et al.

[11] Patent Number: 5,237,273
[45] Date of Patent: Aug. 17, 1993

[54] INTERLEAVED ACQUISITION OF MULTI-SLICE NMR DATA

[75] Inventors: Donald B. Plewes; Jonathan E. Bishop, both of Ontario, Canada

[73] Assignee: General Electric Company, Milwaukee, Wis.

[21] Appl. No.: 703,989

[22] Filed: May 22, 1991

[51] Int. Cl.5 .............................................. G01V 3/00
[52] U.S. Cl. .................................... 324/309; 324/307
[58] Field of Search ............... 324/309, 307, 312, 313, 324/314; 128/653.2, 653.3

[56] References Cited

U.S. PATENT DOCUMENTS

| | | | |
|---|---|---|---|
| 4,717,879 | 1/1988 | Riederer et al. | 324/309 |
| 4,843,322 | 6/1989 | Glover | 324/309 |
| 4,847,560 | 7/1989 | Sattin | 324/309 |
| 4,908,578 | 3/1990 | Van Liere | 324/309 |

Primary Examiner—Louis Arana
Attorney, Agent, or Firm—Quarles & Brady

[57] ABSTRACT

A pulse sequence for a multi-slice $T_2$-weighted NMR scan acquires three NMR echo signals from three separate slices in a single TE time interval. The three separate slices are excited by a set of three selective RF excitation pulses followed by a set of three selective RF echo pulses. Three NMR echo signals are subsequently acquired in the presence of three successive readout gradient pulses.

7 Claims, 6 Drawing Sheets

INTERLEAVED ACQUISITION OF MULTI-SLICE NMR DATA

BACKGROUND OF THE INVENTION

The field of the invention is nuclear magnetic resonance imaging methods and systems. More particularly, the invention relates to a method for reducing the total scan time for multi-slice acquisition of NMR data.

Any nucleus which possesses a magnetic moment attempts to align itself with the direction of the magnetic field in which it is located. In doing so, however, the nucleus precesses around this direction at a characteristic angular frequency (Larmor frequency) which is dependent on the strength of the magnetic fields and on the properties of the specific nuclear species (the magnetogyric constant $\gamma$ of the nucleus). Nuclei which exhibit this phenomena are referred to herein as "spins".

When a substance such as human tissue is subjected to a uniform magnetic field (polarizing field $B_z$), the individual magnetic moments of the spins in the tissue attempt to align with this polarizing field, but precess about it in random order at their characteristic Larmor frequency. A net magnetic moment $M_z$ is produced in the direction of the polarizing field, but the randomly oriented magnetic components in the perpendicular, or transverse, plane (x-y plane) cancel one another. If, however, the substance, or tissue, is subjected to a magnetic field (excitation field $B_1$) which is in the x-y plane and which is near the Larmor frequency, the net aligned moment, $M_z$, may be rotated, or "tipped", into the z-y plane to produce a net transverse magnetic moment $M_1$, which is rotating, or spinning, in the x-y plane at the Larmor frequency. The degree to which the net magnetic moment $M_z$ is tipped, and hence the magnitude of the net transverse magnetic moment $M_1$ depends primarily on the length of time and the magnitude of the applied excitation field $B_1$.

The practical value of this phenomenon resides in the signal which is emitted by the excited spins after the excitation signal $B_1$ is terminated. In simple systems the excited spin induce an oscillating sine wave signal in a receiving coil. The frequency of this signal is the Larmor frequency, and its initial amplitude, $A_0$, is determined by the magnitude of the transverse magnetic moment $M_1$. The amplitude, A, of the emission signal decays in an exponential fashion with time, t:

$$A = A_0 e^{-t/T^*_2}$$

The decay constant $1/T^*_2$ depends on the homogeneity of the magnetic field and on $T_2$, which is referred to as the "spin-spin relaxation" constant, or the "transverse relaxation" constant. The $T_2$ constant is inversely proportional to the exponential rate at which the aligned precession of the spins dephase after removal of the excitation signal $B_1$ in a perfectly homogeneous field. As will be explained below, this characteristic is used in medical imaging to contrast tissues containing spins that exhibit different spin-spin relaxation times.

Another important factor which contributes to the amplitude A of the NMR signal is referred to as the spin-lattice relaxation process which is characterized by the time constant $T_1$. This is also called the longitudinal relaxation process as it describes the recovery of the net magnetic moment M to its equilibrium value along the axis of magnetic polarization (z). The $T_1$ time constant is longer than $T_2$, much longer in most substances of medical interest. The $T_1$ time constant is important in medical imaging because it determines the rate at which NMR measurements can be repeated without significantly degrading the NMR signal.

The NMR measurements of particular relevance to the present invention are called "pulsed NMR measurements". Such NMR measurements are divided into a period of excitation and a period of signal emission. Such measurements are performed in a cyclic manner in which the NMR measurement is repeated many times to accumulate different data during each cycle or to make the same measurement at different locations in the subject. A wide variety of preparative excitation techniques are known which involve the application of one or more pulses ($B_1$) of varying magnitude and duration. Such excitation pulses may have a narrow frequency spectrum (selective excitation pulse), or they may have a broad frequency spectrum (nonselective excitation pulse) which produces transverse magnetization $M_1$ over a range of resonant frequencies.

When utilizing NMR to produce images, a technique is employed to obtain NMR signals from specific locations in the subject. This is accomplished by employing magnetic fields ($G_x$, $G_y$, and $G_z$) which have the same direction as the polarizing field $B_0$, but which have a gradient along the respective x, y and z axes. By controlling the strength of these gradients during each NMR cycle, the spatial distribution of spin excitation can be controlled and the location of the resulting NMR signals can be identified. The resulting set of received NMR signals are digitized and processed to reconstruct the image using one of many well known reconstruction techniques.

An image is reconstructed from the acquired NMR signals by performing a Fourier transform (FT). The preferred embodiment of the present invention employes a variant of the well known FT image reconstruction technique, which is frequently referred to as "spin-warp". The spin-warp technique is discussed in an article entitled "Spin Warp NMR Imaging and Applications to Human Whole-Body Imaging" by W. A. Edelstein et al., *Physics in Medicine and Biology*. Vol. 25, pp. 751-756 (1980).

The spin-warp technique employs a pulse sequence in which a slice of spins are excited by applying a "selective" RF excitation pulse in the presence of a slice select magnetic field gradient ($G_z$). In a two-dimensional implementation (2DFT), for example, spatial information is encoded in one direction by then applying a phase encoding gradient ($G_y$) along that direction, and then a spin-echo signal is acquired in the presence of a readout magnetic field gradient ($G_x$) in a direction orthogonal to the phase encoding direction. The readout gradient present during the spin-echo acquisition encodes spatial information in the orthogonal direction. In a typical 2DFT pulse sequence, the magnitude of the phase encoding gradient pulse $G_y$ is incremented ($2G_y$) in a sequence of views that are acquired during the scan to produce a set of NMR data from which an entire image can be reconstructed.

Typically, during a scan data is acquired for 10 to 20 separate images. In such "multi-slice" scans, NMR signals are acquired from one slice while the spins in the other slices are undergoing the longitudinal relaxation process ($T_1$ relaxation). The measurement cycles from different slices are interleaved during the scan such that there is no idle time while spins in a slice are allowed to undergo the longitudinal relaxation process.

As is well known in the art, $T_2$-weighted contrast NMR images have many clinical, diagnostic purposes. Such images are typically produced by using a standard spin echo pulse sequence as described above, but with a much longer echo time (TE=80 milliseconds) and a much longer pulse repetition time (TR=2000 milliseconds). Such a scan may, for example, require from 12 to 17 minutes to complete. More recently, a method for shortening the pulse repetition time (TR) for $T_2$-weighted contrast scans has been proposed by T. C. Mills, D. A. Orthendahl, and N. M. Hylton, in IEEE Trans, Nucl. Sci. 33,496 (1986). This method reduces the flip angle of the RF excitation pulse from its nominal value of 90 degrees and it reduces TR by a factor of two to four times. However, because the echo time (TE) of the pulse sequence remains long, the shortened TR time results in fewer interleaved views being acquired during the scan. This in turn results in fewer slices being acquired. In otherwords, the proposed method reduces the total scan time by a factor of two to four times, but the number of slices acquired during the scan is reduced by a corresponding amount.

SUMMARY OF THE INVENTION

The present invention relates to a method for acquiring NMR data in which MNR signals from a plurality of slices are acquired during a single pulse sequence. More particularly, the NMR pulse sequence includes: applying a plurality of selective RF excitation pulses to the subject in the presence of a slice-select magnetic field gradient and in which each RF excitation pulse selects a different slice; applying a corresponding plurality of selective RF echo pulses to the subject in the presence of a slice-select magnetic field gradient; applying a phase encoding magnetic field gradient pulse; and acquiring a corresponding plurality of NMR signals in the presence of a readout gradient.

A general object of the invention is to acquire NMR signals from a plurality of separate slices during a single pulse sequence. Spins in separate slices are excited and refocused by a succession of selective RF excitation and refocusing pulses. The resulting NMR echo signals for the respective slices occur at separate times (TE) after the successive RF excitation pulses and are acquired separately during the application of the readout gradient. As a result, a single view for each of a plurality of separate slices is acquired during a single pulse sequence.

Another object of the invention is to shorten a multi-slice, $T_2$-weighted NMR scan. The repetition time TR is shortened to reduce the over all scan time and the number of slices acquired is maintained at the desired number by acquiring data for more than one slice during each pulse sequence, or TE period.

The foregoing and other objects and advantages of the invention will appear from the following description. In the description, reference is made to the accompanying drawings which form a part hereof, and in which there is shown by way of illustration a preferred embodiment of the invention. Such embodiment does not necessarily represent the full scope of the invention, however, and reference is made therefore to the claims herein for interpreting the scope of the invention.

DESCRIPTION OF THE PREFERRED EMBODIMENT

Figure 1:
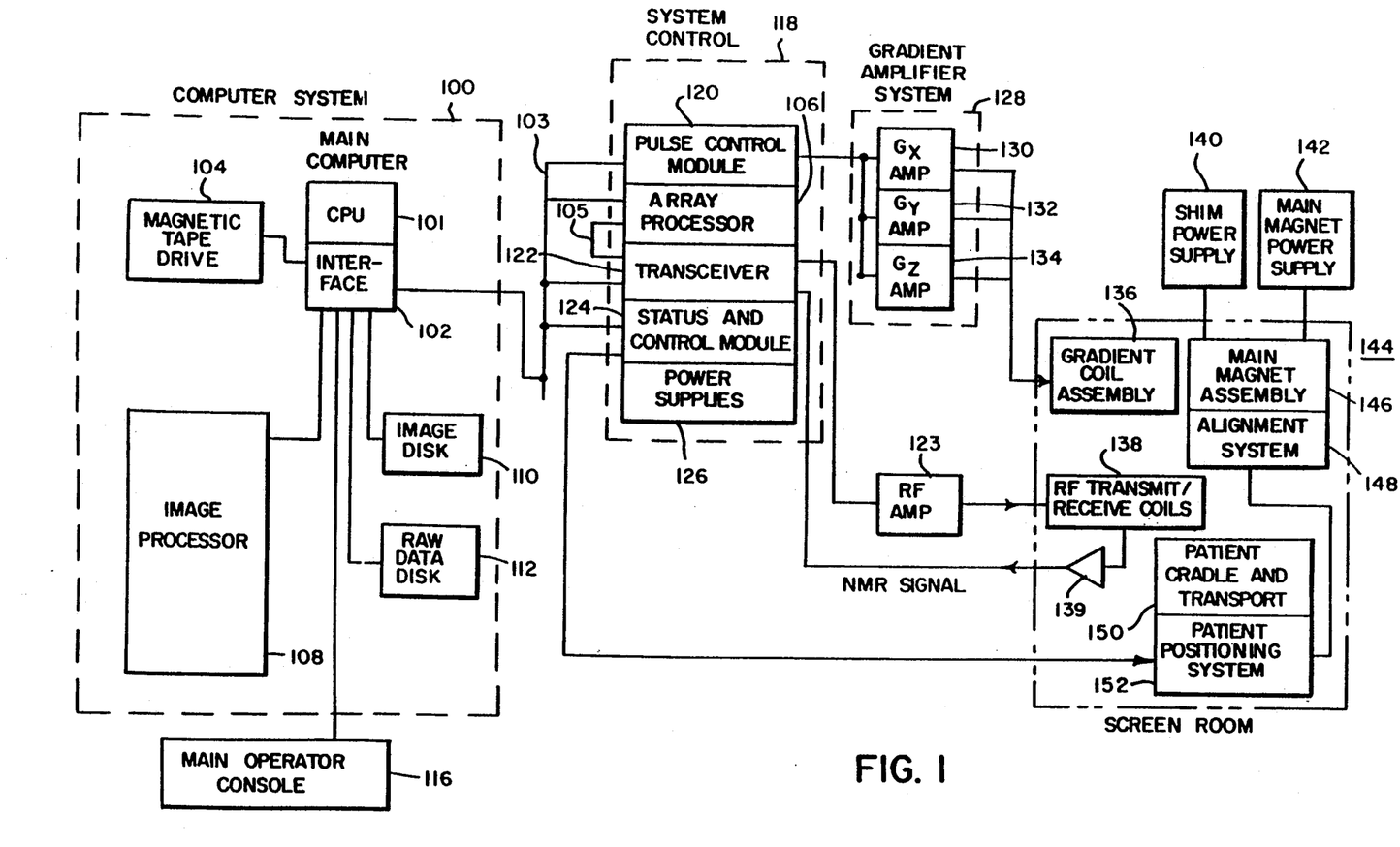
FIG. 1 is a block diagram of an NMR system which employs the present invention.

Referring to FIG. 1, there is shown in block diagram form the major components of a preferred NMR system which incorporates the present invention and which is sold by the General Electric Company under the trademark "SIGNA". The overall operation of the system is under the control of a host computer system generally designated 100 which includes a main computer 101 (a Data General MV4000). The computer 100 includes an interface 102 through which a plurality of computer peripheral devices and other NMR system components are coupled to the main computer 101. Among the computer peripheral devices is a magnetic tape drive 104 which may be utilized under the direction of the main computer 101 for archiving patient data and image data to tape. Processed patient data may also be stored in an image disc storage device designated 110. An array processor 106 is utilized for preprocessing acquired NMR data and for image reconstruction. The function of image processor 108 is to provide interactive image display manipulation such as magnification, image comparison, gray-scale adjustment and real time data display. The computer system 100 also includes a means to store raw NMR data (i.e. before image construction) which employs a disc data storage system designated 112. An operator console 116 is also coupled to the main computer 101 by means of interface 102, and it provides the operator with the means to input data pertinent to a patient study as well as additional data necessary for proper NMR system operation, such as calibrating, initiating and terminating scans. The operator console is also used to display images stored on disc or magnetic tape.

The computer system 100 exercises control over the NMR system by means of a system control 118 and a gradient amplifier system 128. Under the direction of a stored program, the computer 100 communicates with system control 118 by means of a serial communication network 103 (such as the Ethernet network) in a manner well known to those skilled in the art. The system control 118 includes several subsystems such as a pulse control module (PCM) 120, a radio frequency transceiver 122, a status control module (SCM) 124, and power supplies generally designated 126. The PCM 120 utilizes control signals generated under program control by main computer 101 to generate digital waveforms which control gradient coil excitation, as well as RF envelope waveforms utilized in the transceiver 122 for modulating the RF excitation pulses. The gradient waveforms are applied to the gradient amplifier system 128 which is comprised of $G_x$, $G_y$ and $G_z$ amplifiers 130, 132 and 134, respectively. Each amplifier 130, 132 and 134 is utilized to excite a corresponding gradient coil in an assembly designated 136 which is part of a magnet assembly 146. When energized, the gradient coils generate magnetic field gradients $G_x$, $G_y$ and $G_z$.

The gradient magnetic fields are utilized in combination with radio frequency pulses generated by transceiver 122, RF amp 123 and RF coil 138 to encode spatial information into the NMR signals emanating from the region of the patient being studied. Waveforms and control signals provided by the pulse control module 120 are utilized by the transceiver subsystem 122 for RF carrier modulation and mode control. In the transmit mode, the transmitter provides a radio frequency signal to an RF power amplifier 123 which then energizes RF coils 138 which are situated within main magnet assembly 146. The NMR signals radiated by the excited spin in the patient are sensed by the same or a different RF coil than is used for transmitting. The signals are detected, amplified, demodulated, filtered, and digitized in the receiver section of the transceiver 122. The processed signals are transmitted to the main computer 101 by means of a dedicated, unidirectional, high-speed digital link 105 which links interface 102 and transceiver 122.

The PCM 120 and SCM 124 are independent subsystems both of which communicate with main computer 101, peripheral systems, such as patient positioning system 152, as well as to one another by means of serial communications link 103. The PCM 120 and SCM 124 are each comprised of a 16-bit microprocessor (such as Intel 8086) for processing commands from the main computer 101. The SCM 124 includes means for acquiring information regarding patient cradle position, and the position of the moveable patient alignment light fan beam (not shown). This information is used by main computer 101 to modify image display and reconstruction parameters. The SCM 124 also initiates functions such as actuation of the patient transport and alignment systems.

The gradient coil assembly 136 and the RF transmit and receiver coils 138 are mounted within the bore of the magnet utilized to produce the polarizing magnetic field. The magnet forms a part of the main magnet assembly which includes the patient alignment system 148, a shim coil power supply 140, and a main magnet power supply 142. The main power supply 412 is utilized to bring the polarizing field produced by the magnet to the proper operating strength of 1.5 Tesla and is then disconnected.

To minimize interference from external sources, the NMR system components comprised of the main magnet assembly, the gradient coil assembly, and the RF transmit and receiver coils, as well as the patient-handling devices, are enclosed in an RF shielded room generally designated 144. The shielding is generally provided by a copper or aluminum screen network which encloses the entire room. The screen network serves to contain the RF signals generated by the system, while shielding the system from RF signals generated outside the room.

Figure 2:
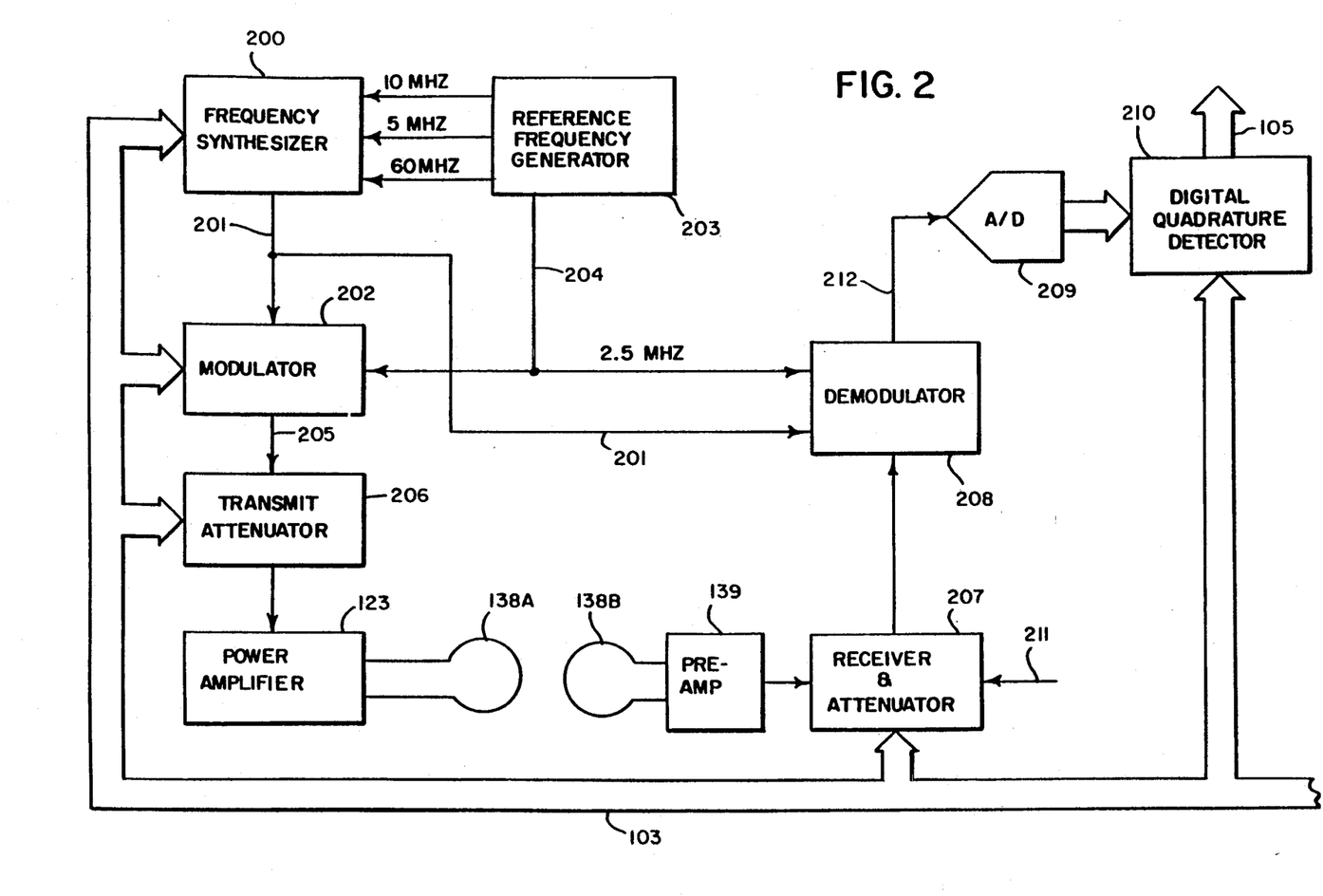
FIG. 2 is an electrical block diagram of the transceiver which forms part of the NMR system of FIG. 1.

Referring particularly to FIGS. 1 and 2, the transceiver 122 includes components which produce the RF excitation field $B_1$ through power amplifier 123 at a coil 138A and components which receive the resulting NMR signal induced in a coil 138B. The base, or carrier, frequency of the RF excitation field is produced by a frequency synthesizer 200 which receives a set of digital signals through the communications link 103 from the main computer 101. These digital signals indicate the frequency which is to be produced at an output 201 at a resolution of one Hertz. This commanded RF carrier is applied to a modulator 202 where it is frequency and amplitude modulated in response to signals received through bus 103. The magnitude of the RF excitation pulse output through line 205 is attenuated by a transmit attenuator circuit 206 which receives a digital signal from the PCM 120 through bus 103. The attenuated RF excitation pulses are applied to the power amplifier 123 that drives the RF transmitter coil 138A.

Referring still to FIGS. 1 and 2, the NMR signal produced by the excited spin in the subject is picked up by the receiver coil 138B and applied to the input of a receiver 207 through a pre-amp 139. The receiver 207 amplifies the NMR signal and this is attenuated by an amount determined by a digital attenuation signal received from the PCM 120 through bus 103. The receiver 207 is also turned on and off by a signal through line 211 from the PCM 120 such that the NMR signal is acquired only over the time intervals required by the particular acquisition being performed.

The received NMR signal is demodulated by a quadrature detector 208 to produce two signals I and Q that are coupled to a pair of analog to digital converters indicated collectively at 209. The demodulator 208 also receives an RF reference signal from a second frequency synthesizer 201 and this is employed to sense the amplitude of that component of the NMR signal which is in phase with the transmitter RF carrier (I signal) and the amplitude of that component of the NMR signal which is in quadrature therewith (Q signal).

The I and Q components of the received NMR signal are continuously sampled and digitized by the A/D converter 209 at a sample rate of 64 kHz throughout the acquisition period. A set of 256 digital numbers are acquired for each I and Q component of the NMR signal, and these digital numbers are conveyed to the main computer 101 through the serial link 105.

Figure 5:
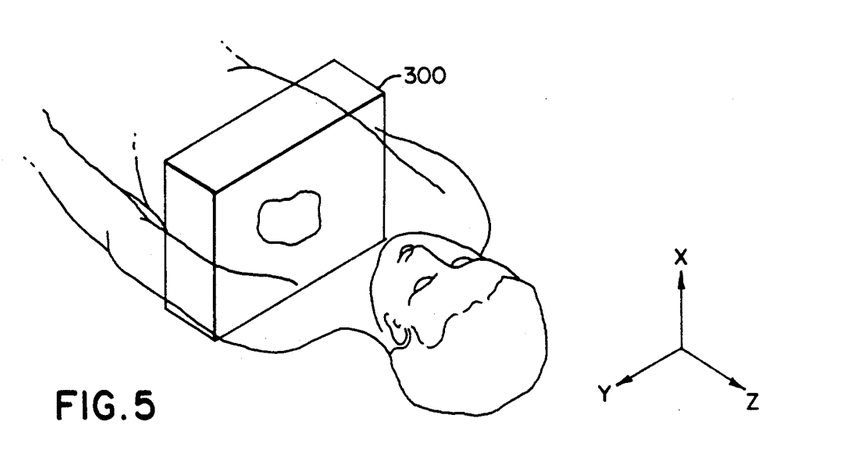
FIG. 5 is a pictoral view showing a typical acquisition of a plurality of slices of NMR data from a patient.

The NMR system of FIG. 1 performs a series of pulse sequences to collect sufficient NMR data to reconstruct a set of images. Typically, a scan will collect NMR data from which ten to twenty images can be reconstructed. As indicated for example in FIG. 5, such images may be reconstructed as a series of slices 300 taken through the chest of a patient. The scan is conducted under the direction of a program which is executed by the main computer 101 in the NMR system of FIG. 1. This program directs the system to perform a series of pulse sequences to acquire NMR data according to the present invention.

Figure 3:
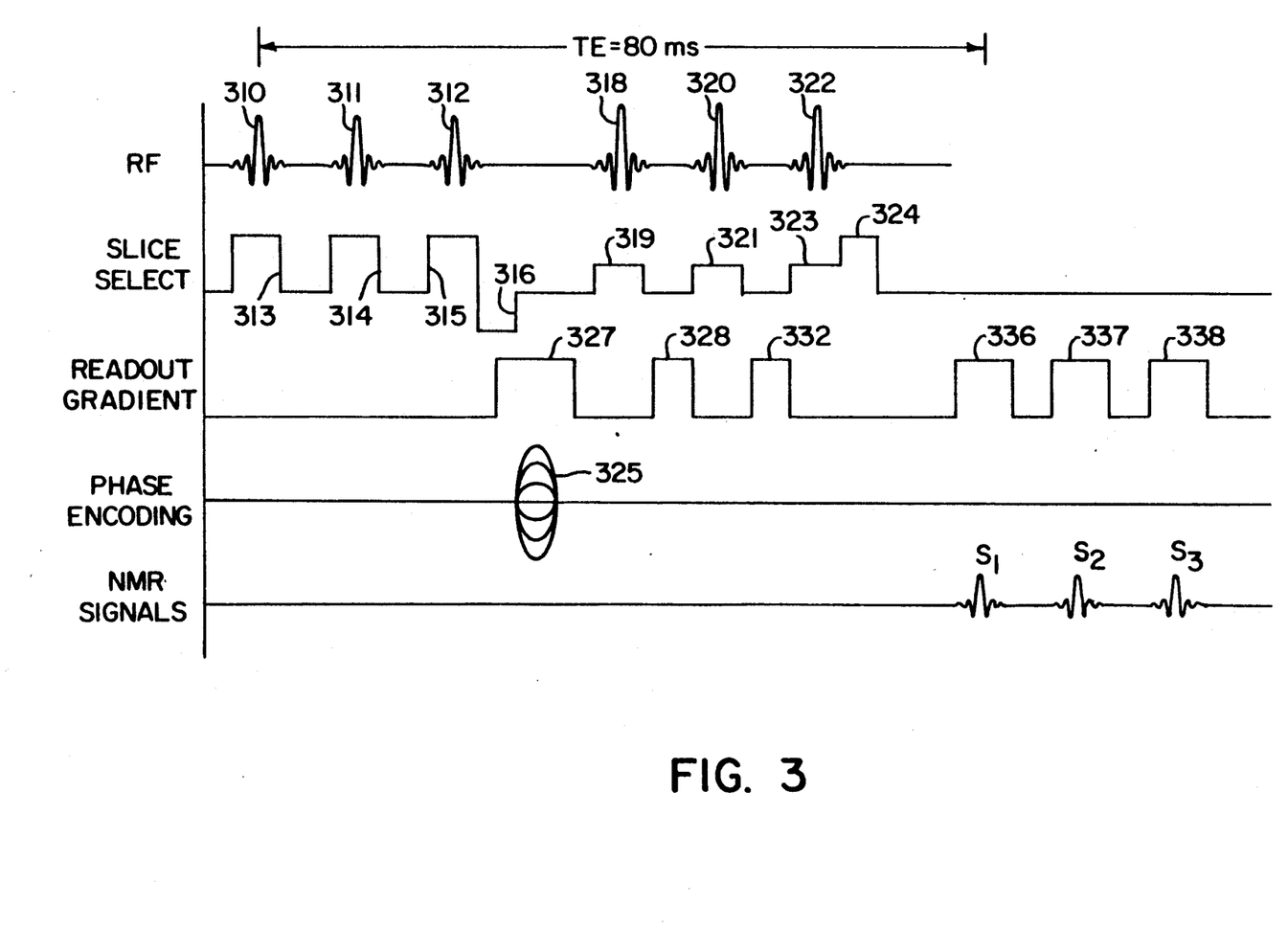
FIG. 3 is a graphic representation of a preferred embodiment of an NMR pulse sequence used to acquire data in accordance with the present invention.

The preferred embodiment of the invention is implemented by performing the pulse sequence of FIG. 3. This pulse sequence is similar to the conventional spin-warp sequence in that it includes the generation of RF excitation pulses, slice select gradient pulses, phase encoding gradient pulses and readout gradient pulses. In sharp contrast to prior methods, however, the pulse sequence of the present invention excites three separate slices and acquires three separate NMR signals $S_1$, $S_2$, and $S_3$.

Three separate slices are excited by the application of three selective RF excitation pulses 310, 311 and 312 in the presence of three corresponding $G_z$ slice select gradient pulse 313, 314 and 315. The selective RF excitation pulses 310–312 provide a tip angle of greater than 90° for a single echo sequence, as taught in the above publication by T. C. Miles et al, and the center frequency of each is selected to excite different ones of the slices 300 in the region of interest. A negative rephasing $G_z$ gradient pulse 316 is applied after the three slices have been excited to rephase the spin in the well known manner. The slice select gradient pulses 313–315 have the same magnitude and duration (i.e. strength) and the rephasing pulse 316 has half the strength to realign the spin phase after the slice select process. At a time interval (TE/2 = 40 milliseconds) after the first RF excitation pulse 310, a first, selective 180° RF echo pulse 318 is applied in the presence of a $G_z$ slice select gradient pulse 319. Similarly, second and third selective 180° RF echo pulses 320 and 322 are produced at the same time interval after the respective second and third RF excitation pulses 311 and 312 in the presence of respective $G_z$ slice select gradient pulses 321 and 323. This is followed immediately by a $G_z$ rephasing pulse 324 which has a strength that is twice that of the equally valued $G_z$ slice select gradient pulses 319, 321 and 323. The respective gradient pulses 319, 321 and 323 have one half the strength of the respective gradient pulses 313–315.

As a result of this excitation, three NMR echo signals $S_1$ $S_2$ and $S_3$ are generated at an echo time (TE = 80 milliseconds) after the respective RF excitation pulses 310–312. These three signals $S_1$ $S_2$ and $S_3$ are separately acquired and stored in separate arrays as one view from each of three separate slices. The pulse sequence is then repeated to acquire three more NMR signals from three other slices in the region of interest. The pulse sequence is repeated until a sample, or view, is acquired from all slices in the region of interest. For example, in a twelve slice scan, slices 1, 3 and 5; 7, 9 and 11; 2, 4 and 6; and 8, 10 and 12 are acquired in four successive pulse sequences.

The pulse sequence of FIG. 3 employs a phase encoding gradient pulse 325 which is stepped through 256 discrete values during the scan to acquire 256 separate views of each slice. Accordingly, after the NMR echo signals are acquired for each of the slices in the region of interest, the phase encoding gradient pulse 325 is stepped to a new value and the next view is acquired at a rate of three slices per pulse sequence. In a twelve slice scan, therefore, the pulse sequence of FIG. 3 is executed 1024 times (256 views × 12/3 slices), whereas in a conventional scan the pulse sequence is executed 3072 times (256 views × 12 slices).

During data acquisition, the consecutive spin echoes are acquired from separate slices, necessitating modifications to the readout gradient ($G_x$) and slice select gradient ($G_z$). Considering the $G_x$ waveform first, we note that as several slices are excited simultaneously, it is necessary to arrange the readout gradient pulses $G_x$ such that all echoes except the one corresponding to the desired slice are dephased, to eliminate signal detection from multiple slices. In order to achieve this condition it is necessary that the following three conditions be met.

Figure 6A:
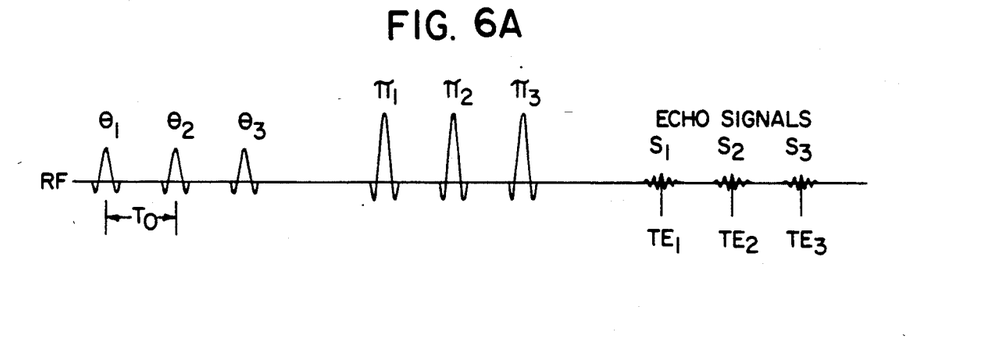
FIGS. 6A-6C are graphic representations used to explain the readout gradient pulses for the pulse sequence of FIG. 3 and a flow compensated pulse sequence.
Figure 6B:
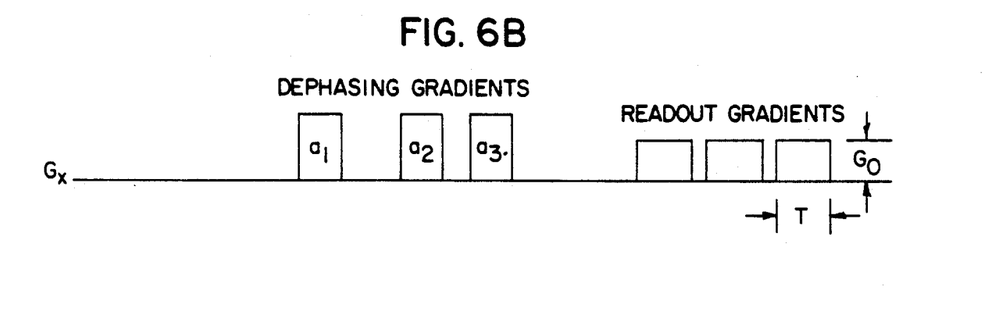

(i) The RF excitation pulses must have a spacing $T_0$ as shown in FIG. 6A which is greater than the echo signal acquisition period time (T = number of samples/bandwidth) as shown in FIG. 6B such that the RF echo signals can be fully sampled without interference with each other.

(ii) The phase dispersion $\phi_i$ of the transverse magnetization due to the readout gradient $G_x$ must be zero at the center of the echo signal (TE).

(iii) The phase dispersion $\phi_i$ of the transverse magnetization for each slice due to the readout gradient $G_x$ must not refocus at any other time than its echo time $TE_i$.

Referring particularly to FIG. 6B, these considerations may be met with three $G_x$ dephasing gradient pulses $a_1$, $a_2$ and $a_3$ that allow the phase dispersion for each slice to be independently adjusted. For example, dephasing gradient $a_2$ will simultaneously rephase spins in slice 1 (which has just been refocused by $\pi_1$), while dephasing the magnetization from slices 2 and 3, which have not yet been refocused. Condition (ii) above requires that the following three equations be satisfied:

$$\phi_1(t = TE_1) = \gamma \int G_x(t)dt \quad (1)$$
$$= \gamma(a_1 - a_2 - a_3 - G_0T/2) = 0$$

$$\phi_2(t = TE_2) = \gamma(a_1 + a_2 - a_3 - 3G_0T/2) = 0 \quad (2)$$

$$\phi_3(t = TE_3) = \gamma(a_1 + a_2 + a_3 - 5G_0T/2) = 0 \quad (3)$$

where $a_{1,2,3}$ are adjustable zeroth moments of the dephasing $G_x$ gradient pulses and $G_0$,T are the amplitude and duration of each readout gradient, respectively. Solving equations 1–3 gives:
$a_1 = 3G_0T/2$
$a_2 = G_0T/2$
$a_3 = G_0T/2$ In general, the solution for n slices is $a_1 = nG_0T/2$ and $a_i = G_0T/2$ for $2 < i < n$.

Figure 4:
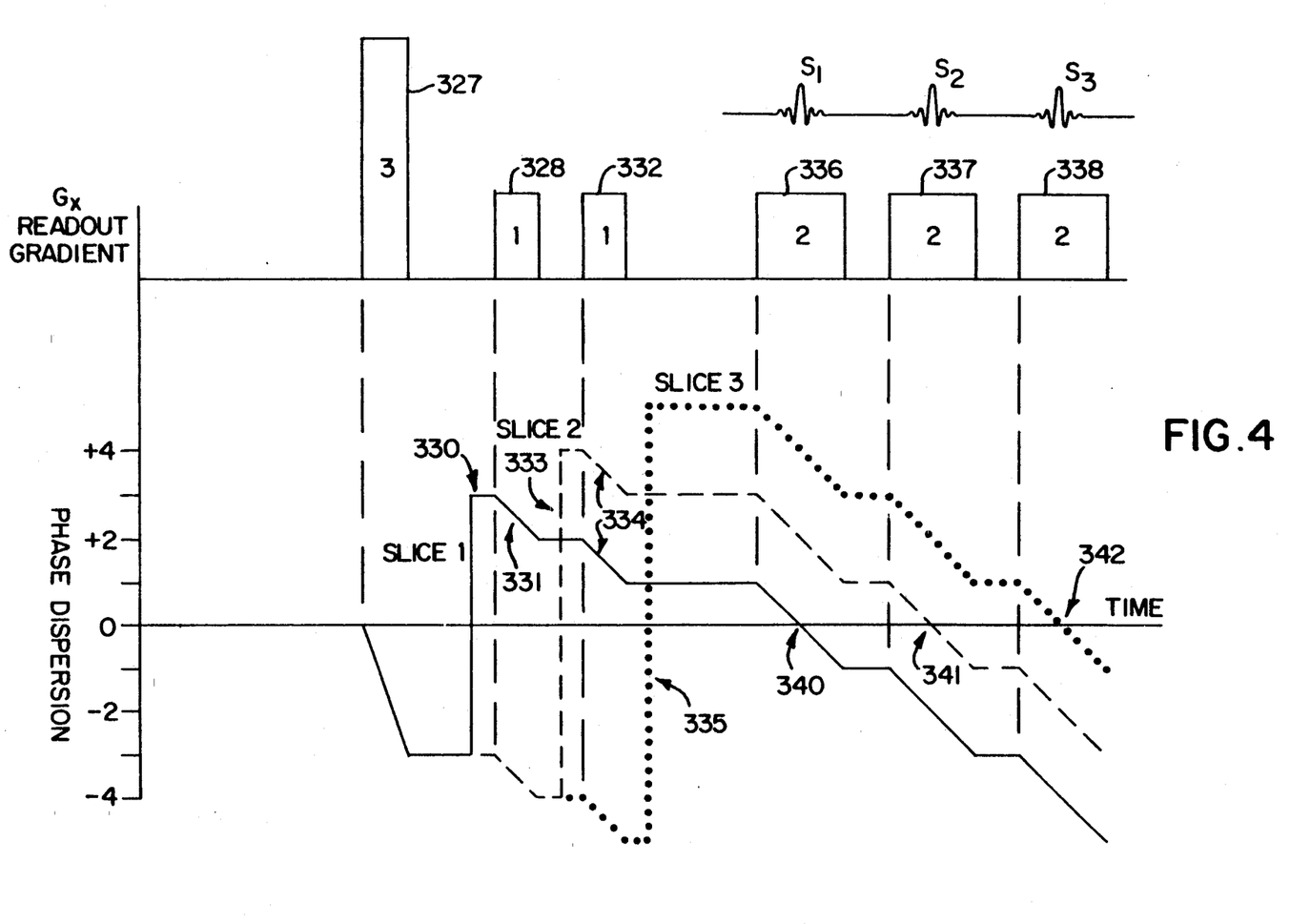
FIG. 4 is a graphic representation of the readout gradient pulses applied in the pulse sequence of FIG. 3 and the resulting effect on phase dispersion in each slice.

Referring particularly to FIG. 4, the effect of the readout gradient pulses on the phase dispersion for each slice is shown. A first $G_x$ gradient pulse 327 is produced after excitation and before the RF echo pulses 318, 320 and 322 to dephase the spins by an amount $a_1 = -3\phi_x$. After the first RF echo pulse 318 is applied, a second $G_x$ gradient pulse 328 is applied, and as shown in FIG. 4, this provides a further dephasing in the amount of $a_2 = -\phi_x$ for the second and third slices being sampled. However, because the phase of the spins in the first slice have been reversed by the first RF echo pulse 318 at 330, the $G_x$ gradient pulse 328 actually reduces the dephasing in the first slice as indicated at 331. Similarly, a third $G_x$ gradient pulse 332 is applied after the second RF echo pulse 320 is produced to further dephase the spins in the third slice by an amount $a_3 = -\phi_x$. As indicated at 333, because the phase of the spins in the second slice is reversed by the second RF echo pulse 320, the third $G_x$ gradient pulse 332 serves to rephase the spins in the first and second slices by an amount $\phi_x$ as indicated at 334. As a result, after the third RF echo pulse 322 is applied and the phase dispersion of the spins in the third slice is reversed as indicated at 335, all three slices have a positive phase dispersion in the respective amounts of $\phi_x$, $3\phi_x$ and $5\phi_x$.

Referring to FIGS. 3 and 4, during the acquisition of the three NMR echo signals $S_1$ $S_2$ and $S_3$, $G_x$ readout gradient pulses 336, 337 and 338 are applied. The first readout gradient pulse 336 rephases the spins in the first slice simultaneously with the occurrence of the center of the NMR echo signal $S_1$ as indicated at 340. Similarly, the second readout gradient pulse 337 rephases the spins in the second slice at the center of the NMR echo signal S₂ as indicated at 341, and the third readout gradient pulse 338 rephases the spins in the third slice at the center of the NMR echo signal S₃, as indicated at 342. Consequently, the pulse sequence of FIG. 3 produces separate NMR echo signals S₁ S₂ and S₃ for three separate slices.

The benefit of the present invention is illustrated in Table 1 which compares the multi-slice capacity using the present invention (right) with a standard multi-planer pulse sequence (left) over a range of TE and TR values. Each pair of values indicates the number of slices that may be acquired within a single TR period, for 24 cm field-of-view, 1 cm slice thickness, 32 kH$_z$ bandwidth, and maximum gradient amplitudes of 10 mT/m.

TABLE 1

| TE (ms) | TR (ms) | | |
|---|---|---|---|
| | 500 | 800 | 100 |
| 20 | 13/13 | 21/21 | 27/27 |
| 40 | 8/14 | 14/24 | 17/30 |
| 60 | 6/15 | 10/24 | 12/30 |
| 80 | 5/16 | 8/24 | 10/32 |
| 100 | 4/15 | 6/25 | 8/30 |

In a conventional multi-slice scan, the order in which the slices are acquired is arranged to minimize the effects of RF slice interference. This is achieved by acquiring the odd slices first, followed by the even slices. The minimum time between excitation of adjacent slices is approximately one half the TR period. When the present invention is employed, however, a different ordering is required because a plurality of slices are acquired within each pulse sequence, or TE period. For example, in a twelve slice scan the order of slice acquisition is preferably (1, 4, 7) (2, 5, 10) (3, 8, 11) and (6, 9, 12).

Figure 6C:
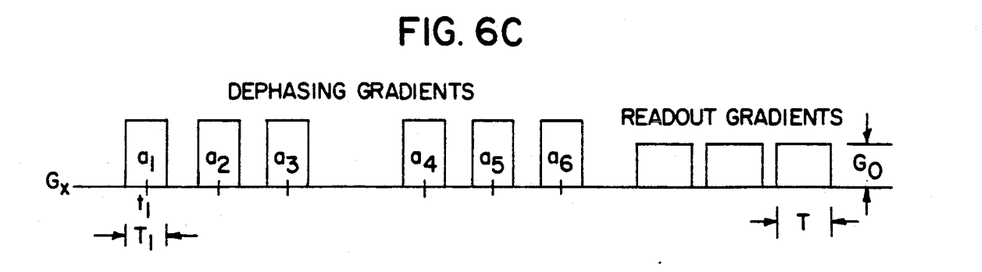

To achieve flow compensation with the present invention, the first moment of the readout gradient G$_x$ and slice select gradient G$_z$ must be nulled. For each echo signal location, there are now two conditions that must be met at their TE time, so that six dephasing gradient pulses are required to fulfill these conditions. In the case of the G$_x$ readout gradient, the waveforms must be placed as indicated in FIG. 6 to ensure that both the first and zeroth moments of G$_x$, for each of three slices, can be independently adjusted. The first moment condition leads to three expressions in addition to the above equations (1-3):

$$\phi_1(t = TE_1) = \gamma \int t G_x(t) dt \quad (4)$$
$$= \gamma(a_1 t_1 + a_2 t_2 + a_3 t_3 - a_4 t_4 - a_5 t_5 - a_6 t_6 - G_0((TE_1)(T) - T^2/4)/2) = 0$$

$$\phi_1(t = TE_2) = \gamma(a_2 t_2 + a_3 t_3 + a_4 t_4 - a_5 t_5 - a_6 t_6 - (G_0)(TE_1)(T) - G_0((TE_2)(T) - T^2/4)/2) = 0 \quad (5)$$

$$\phi_1(t = TE_3) = \gamma(a_3 t_3 + a_4 t_4 + a_5 t_5 - a_6 t_6 - G_0(TE_1 + TE_2)T - G_0(TE_3)(T) - T^2/4)/2) = 0 \quad (6)$$

where t$_{1-6}$ are the times at the center of the six dephasing gradients a$_{1-6}$. The solution of equations (1-6) for the moments a$_{1-6}$ is complicated by the presence of the timing parameters t$_{1-6}$ and TE₁, TE₂, and TE₃. Flow compensation of the slice select gradient G$_z$ is solved analogously to G$_x$. Flow compensation for the phase encoding gradient G$_y$ is not as critical, and it may be left unaltered.

Figure 7:
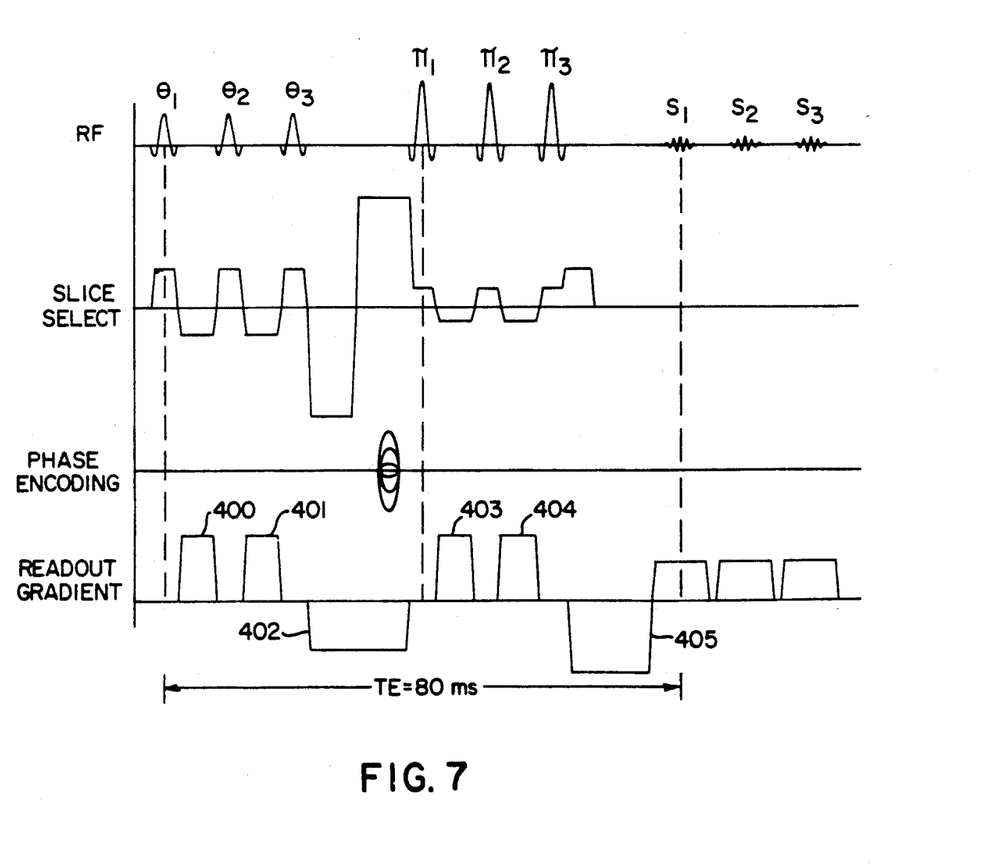
FIG. 7 is a pulse sequence according to the present invention which is flow compensated.

The resulting flow compensated pulse sequence of the present invention is shown in FIG. 7, and from this it can be observed that a readout gradient pulse G$_x$ is produced after each RF excitation pulse $\phi_1 \phi_2$, and $\phi_3$, and each 180° RF echo pulse π₁, π₂ and π₃. The first two G$_x$ gradient pulses 400 and 401 are flow compensated by the third G$_x$ gradient pulse 402 which has the same first moment, but opposite polarity. The same is true of the sixth G$_x$ gradient pulse 405 which flow compensates the fourth and fifth G$_x$ gradient pulses 403 and 404. An examination of the phase dispersion of the transverse excitation produced by the RF excitation pulses $\phi_1$, $\phi_2$ and $\phi_3$ reveals that rephasing occurs at the centers of the respective NMR echo signals S₁, S₂ and S₃.

Due to the large number of RF excitation pulses produced during this pulse sequence, it is possible for stimulated and secondary spin echoes to be produced. These can interfere with the desired spin echo signals and result in image artifacts. Such artifacts can be suppressed, however, by the addition of a spoiler gradient pulse on the readout (G$_x$) axis following acquisition of the last NMR echo signal S₃.

We claim:

1. In an NMR system for acquiring NMR data from a plurality of separate slices through a region of interest, the method comprising:

a) applying a polarizing magnetic field to the region of interest;

b) applying a plurality of selective RF excitation pulses to the region of interest while applying concurrent slice-select magnetic field gradient pulses, such that the spins in a corresponding plurality of separate slices through the region of interest are excited.

c) applying a corresponding plurality of selective RF echo pulses to the region of interest at a time TE/2 after the application of the selective RF excitation pulses while applying concurrent slice-select magnetic field gradient pulses;

d) applying a phase encoding magnetic field gradient pulse to the region of interest;

e) acquiring a corresponding plurality of NMR echo signals at a time TE after the application of the respective selective RF excitations pulses; and f) storing each acquired NMR echo signal as data for a different one of said plurality of separate slices.

2. The method as recited in claim 1 in which a plurality of readout magnetic field gradient pulses are applied to the region of interest, such that the first of said readout magnetic field gradient pulses dephases the excited spins in the plurality of slices and subsequent readout magnetic field gradient pulses rephase the spins in each of the plurality of slices at the respective times the NMR echo signals are acquired from said plurality of slices.

3. The method as recited in claim 2 in which steps a) through f) are repeated a plurality of times and the value of the phase encoding magnetic field gradient pulse is stepped through a corresponding plurality of different values.

4. The method as recited in claim 2 in which the first of said readout magnetic field gradient pulses is applied after the application of the selective RF excitation pulses and before the application of the selective RF echo pulses, in which a readout magnetic field gradient pulse is applied between the application of each of said plurality of selective RF echo pulses, and in which a readout magnetic field gradient pulse is applied as each of said NMR echo signals is acquired.

5. The method as recited in claim 4 in which additional readout magnetic field gradient pulses are applied to flow compensate the acquired NMR echo signal.

6. The method as recited in claim 5 in which the additional flow compensation readout magnetic field gradient pulses includes readout magnetic field gradient pulses applied between the application of each of said selective RF excitation pulses and after the application of all said selective RF echo pulses.

7. The method as recited in claim 1 which includes:
g) applying a readout magnetic field gradient pulse to the region of interest during the acquisition of each of the plurality of NMR echo signals; and
h) applying a spoiler readout magnetic field gradient pulse to the region of interest after the acquisition of said plurality of NMR echo signals.

* * * * *